United States Patent
Blanchard et al.

(10) Patent No.: US 9,975,652 B2
(45) Date of Patent: May 22, 2018

(54) BOXED UNWINDABLE SOLAR GENERATOR

(75) Inventors: Laurent Blanchard, Mouans-Sartoux (FR); Julien Ducarne, Cannes (FR); Yannick Baudasse, Grasse (FR)

(73) Assignee: THALES, Courbevoie (FR)

( * ) Notice: Subject to any disclaimer, the term of this patent is extended or adjusted under 35 U.S.C. 154(b) by 1370 days.

(21) Appl. No.: 13/336,927

(22) Filed: Dec. 23, 2011

(65) Prior Publication Data
US 2012/0167944 A1  Jul. 5, 2012

(30) Foreign Application Priority Data

Dec. 30, 2010 (FR) .................................. 10 05178

(51) Int. Cl.
*H01L 31/044* (2014.01)
*B64G 1/22* (2006.01)
(Continued)

(52) U.S. Cl.
CPC ............... *B64G 1/222* (2013.01); *B64G 1/44* (2013.01); *H01L 31/044* (2014.12); *H01L 31/00* (2013.01); *Y02E 10/50* (2013.01); *Y02E 10/60* (2013.01)

(58) Field of Classification Search
CPC .......... B64G 1/44; B64G 1/443; B64G 1/446; H01L 31/00–31/078; Y02E 10/50–10/60
See application file for complete search history.

(56) References Cited

U.S. PATENT DOCUMENTS

| 3,564,789 | A | 2/1971 | Vyvyan et al. |
| 7,856,735 | B2 | 12/2010 | Allezy et al. |
| | | (Continued) | |

FOREIGN PATENT DOCUMENTS

| FR | 2933771 A1 | 1/2010 |
| JP | 46-002375 | 10/1971 |
| | (Continued) | |

OTHER PUBLICATIONS

Watt, Alan et al, "Tape-Spring Rolling Hinges", Proceedings of the 36 Aerospace Mechanisms Symposium, Glenn Research Center, May 15-17, 2002.*

(Continued)

*Primary Examiner* — Bach T Dinh
(74) *Attorney, Agent, or Firm* — Baker & Hostetler LLP

(57) ABSTRACT

A solar generator deployment device includes at least one primary tape-spring supporting a flexible membrane with a set of flexible photovoltaic cells on one face, at least one secondary tape-spring, and a reinforcing structure attached to the primary tape-spring and secondary tape-spring, said device having a wound state in which the primary tape-spring supporting the flexible membrane and secondary tape-spring and reinforcing structure are co-wound around a mandrel; and an unwound state in which said primary tape-spring and secondary tape-spring are unwound. The device comprises, at the level of said mandrel, means for offsetting, in the unwound state, the root of said secondary tape-spring so that the reinforcing structure is deployed within a volume situated on the side opposite the face of the flexible membrane comprising flexible photovoltaic cells and supports said flexible membrane, the device then being in the deployed state.

15 Claims, 3 Drawing Sheets

(51) Int. Cl.
*B64G 1/44* (2006.01)
*H01L 31/00* (2006.01)

(56) References Cited

U.S. PATENT DOCUMENTS

| | | | |
|---|---|---|---|
| 8,683,755 B1* | 4/2014 | Spence | B64G 1/222 |
| | | | 136/245 |
| 2002/0112417 A1 | 8/2002 | Brown et al. | |
| 2003/0057329 A1 | 3/2003 | Thompson et al. | |
| 2007/0145195 A1 | 6/2007 | Thomson et al. | |
| 2007/0262204 A1* | 11/2007 | Beidleman et al. | 244/172.6 |

FOREIGN PATENT DOCUMENTS

| | | |
|---|---|---|
| JP | 58-136900 U | 9/1983 |
| JP | 09-124000 A | 5/1997 |
| JP | 2010-018275 A | 1/2010 |

OTHER PUBLICATIONS

J.C.H. Yee, et al., "Carbon Fibre Reinforced Plastic Tape Springs", 45th AIAA/ASME/ASCE/AHS/ASC Structures, Structural Dynamics, and Materials Conference, Apr. 19-22, 2004, pp. 1-10, American Institute of Aeronautics and Astronautics, Reston, VA, US.

S.D. Guest, et al., "Analytical Models for Bistable Cylindrical Shells", Proceedings of The Royal Society, Jan. 10, 2006 (published on-line), pp. 839-854, vol. 462.

* cited by examiner

BOXED UNWINDABLE SOLAR GENERATOR

CROSS-REFERENCE TO RELATED APPLICATION

This application claims priority to foreign French patent application No. FR 1005178, filed on Dec. 30, 2010, the disclosure of which is incorporated by reference in its entirety.

FIELD OF THE INVENTION

The field of the invention is that of the deployable structures in space that can advantageously be used for the deployment of very large sized solar generators.

BACKGROUND

Tape-springs are known as such in the space domain as being tapes that can switch from the wound state to the unwound state essentially by virtue of their own elastic energy; in the unwound state, the known tape-springs generally exhibit a rigidity capable of maintaining them in that state.

The conventional tape-springs, generally metallic, therefore have a natural tendency to unfold to be in their stable state. If they are forced to fold up, they have a tendency to form a radius equal to that of their transversal radius of curvature. It therefore requires a weak external force to keep them wound in this form. If this force is abruptly eliminated, the unfolding can be violent and uncontrolled, that is to say that the whole tape-spring may have a tendency to straighten up simultaneously, over its entire length. The conventional tape-springs may thus offer difficulties in terms of controlling their unfolding.

Conventional tape-springs made of composite material have also been developed. The latter have properties that are for the most part similar to those of the conventional metal tape-springs, but offer the advantage of making it possible, to a certain extent, to control their own winding radius. They also offer the advantage of a high rigidity/weight ratio and a low expansion coefficient.

The applicant has already demonstrated that it is possible to associate a conventional tape-spring with a layer of thermoplastic material. This invention was the subject of the patent application FR 0803986. The conventional tape-spring comprising a layer of thermoplastic material can be wound by force, heated then cooled such that the thermoplastic fixes the tape-spring in the wound state, which then becomes the stable state. By locally heating, it is possible to progressively unwind the assembly.

Alternatively, it is possible to use, instead of the thermoplastic material, a thermosetting material or, more generally, a material exhibiting a strong rigidity variation on crossing a temperature threshold.

Finally, by construction, it is possible to render a composite tape-spring bistable. Studies have been published on this issue, such as, notably, "Carbon Fibre Reinforced Plastic Tape-springs", J. C. H. Yee et al., AIAA 2004-1819, and "Analytical models for bistable cylindrical shells", S. D. Guest et al.

The remarkable property of the bistable tape-springs lies in the fact that they are mechanically stable both in the unwound state and in the wound state. The more stable state does, however, remain the unwound state. The bistable tape-springs are wound via a generally great force. They remain stable in the wound state around their natural radius of curvature, with no external force. All that is required is to unfold one end thereof, with a force of low intensity, exerted by a motor-driven system, for example, to initiate the unwinding. The unwinding can be very fast, but remains progressive from the initial unwinding point.

In this context, the general issue to be addressed lies in the deployment of very large sized solar generators and how to deploy a three-dimensional reinforcing structure to support solar generators having a very large surface area.

The prior art does not propose any satisfactory technological solution and the present invention seeks to fill this gap.

SUMMARY OF THE INVENTION

The invention includes a solar generator deployment device comprising at least one primary tape-spring supporting a flexible or semi-rigid membrane, or one consisting of flexible and rigid elements such as thin flat braces linked flexibly together, said membrane having a face on which are arranged a set of elements capable of converting the solar energy into electrical energy. The device according to the invention also comprises at least one secondary tape-spring, and a reinforcing structure attached both to said at least one primary tape-spring and to said at least one secondary tape-spring, said device having a wound state in which said at least one primary tape-spring supporting the membrane and said at least one secondary tape-spring as well as the reinforcing structure are co-wound around a mandrel, and an unwound state in which said at least one primary tape-spring and said at least one secondary tape-spring are unwound, and wherein said device comprises, at the level of said mandrel, means for offsetting, in the unwound state, the root of said at least one secondary tape-spring so that said reinforcing structure is deployed within the volume situated on the side opposite the face of the membrane comprising the elements capable of converting the solar energy into electrical energy, and supports said flexible membrane, the device then being in the deployed state.

Advantageously, said offsetting means may consist of a mobile element linked to the mandrel to which is fixed said at least one secondary tape-spring and not said at least one primary tape-spring or, respectively, said at least one primary tape-spring and not said at least one secondary tape-spring.

Advantageously, said mobile element is a secondary mandrel with the same axis as the mandrel, capable of performing, in the unwound state, a rotation on itself of a fraction of a mandrel turn so as to offset the root of said at least one secondary tape-spring or, respectively, the root of said at least one primary tape-spring.

According to another embodiment, said mobile element consists of a mechanical actuator capable of offsetting the root of said at least one secondary tape-spring or, respectively, the root of said at least one primary tape-spring, relative to the mandrel.

Advantageously, the reinforcing structure may comprise a set of cables or of link rods.

Advantageously, the reinforcing structure may also comprise a set of transversal braces.

According to one embodiment, the device according to the invention comprises two deployment structures, making it possible to deploy two flexible membranes, respectively on either side of the mandrel.

Advantageously, for a first membrane, the offsetting means make it possible to offset the root of said at least one secondary tape-spring and, for a second membrane, the offsetting means make it possible to offset the root of said at least one primary tape-spring.

Advantageously, at least one of the tape-springs comprises a layer of a material exhibiting a strong rigidity variation on crossing a temperature threshold. This makes it possible to ensure the progressive deployment of the whole by heating.

BRIEF DESCRIPTION OF THE DRAWINGS

Other features and advantages of the invention will become apparent from the following description, given in light of the appended drawings, given by way of nonlimiting examples, which represent.

DETAILED DESCRIPTION

Figure 1:
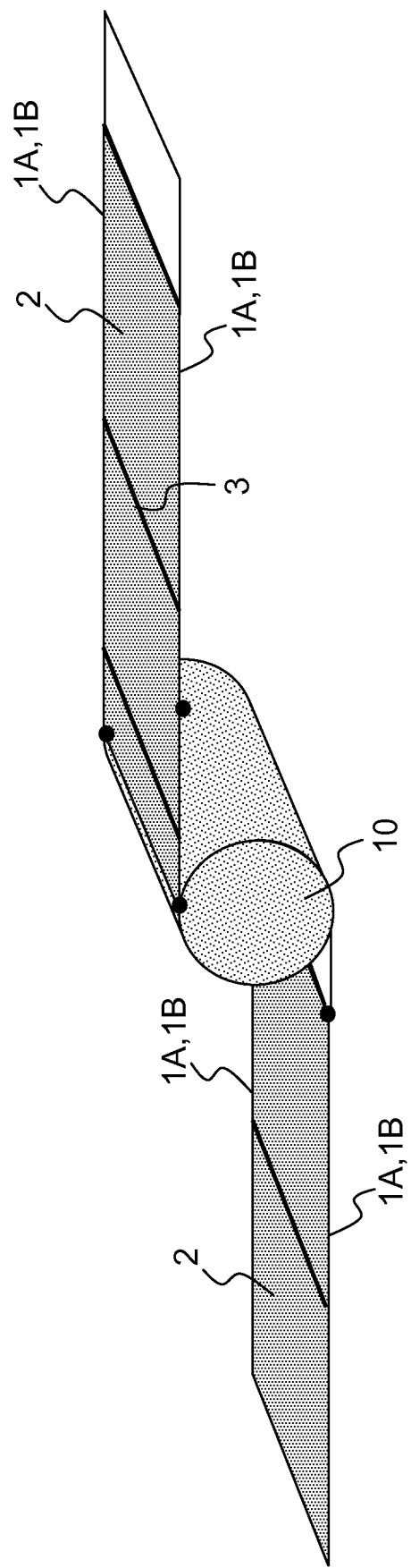
FIG. 1: an example of a device according to the invention during deployment, comprising two membranes coated with solar generators, and their reinforcing structures wound with the membranes.

FIG. 1 shows a diagram of an example of a device according to the invention, during deployment. The latter comprises at least one deployment structure of a flexible membrane 2, supporting a plurality of elements capable of converting the solar energy into electrical energy, such as photovoltaic cells, on one face. Said deployment structure comprises one or a plurality of primary tape-springs 1A constituting a frame supporting said flexible membrane. The device according to the invention can, depending on the implementation, make it possible to deploy two flexible membranes 2 on either side of a mandrel 10—as in the figures—or just a single flexible membrane 2. Moreover, alternatively, the membrane 2 may be semi-rigid, or may consist of flexible and rigid elements such as thin flat braces linked flexibly together.

In the wound state, said primary tape-springs 1A are wound around the mandrel 10, which also ensures a winding support function for the flexible membrane or membranes 2.

Figure 2:
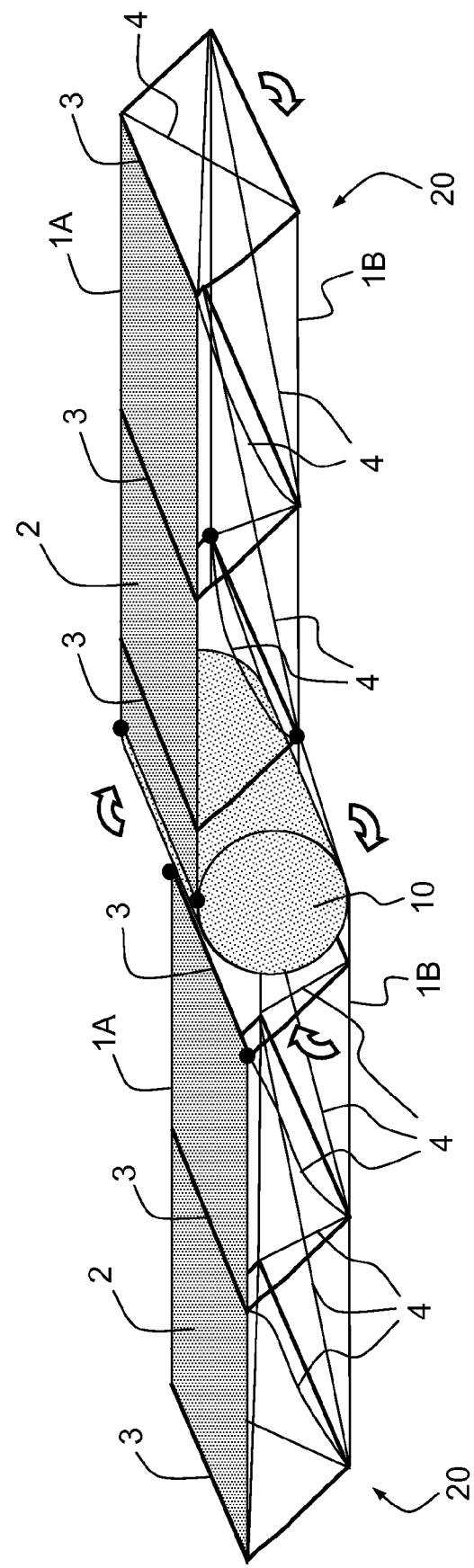
FIG. 2: the same example of a device according to the invention, at a stage of deployment that is more advanced than that of FIG. 1, the reinforcing structure being in the process of deployment.
Figure 3:
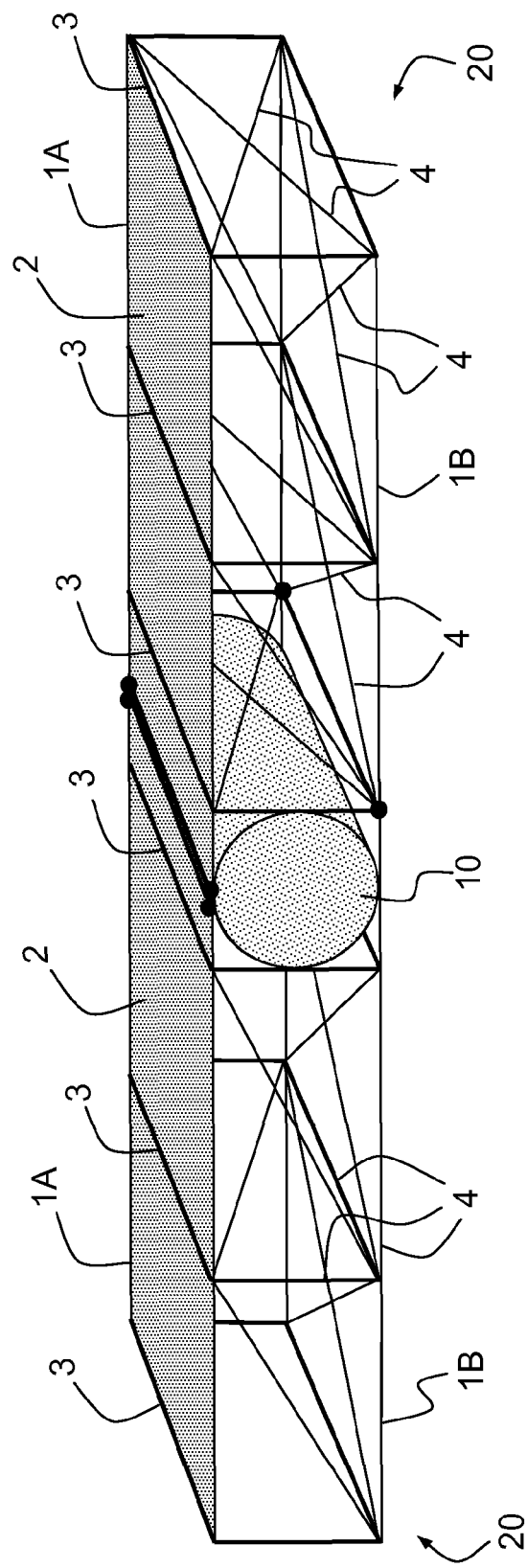
FIG. 3: the same example of a device according to the invention, deployed.

In the embodiment represented in FIGS. 1 to 3, two primary tape-springs 1A form a frame supporting the flexible membrane or membranes 2. Said primary tape-springs 1A, for each flexible membrane 2, are preferably linked by transversal braces 3 in order to ensure the rigidity of the structure.

The deployment device as represented in the figures also comprises at least one secondary tape-spring 1B and a reinforcing structure 20 which are co-wound, in the wound state, with the primary tape-spring 1A, around the mandrel 10, and situated on the face of the membrane on the side opposite the face comprising the elements capable of converting the solar energy into electrical energy.

As represented in FIG. 2, in a more advanced state of deployment, the device according to the invention thus comprises a reinforcing structure 20 in the process of deployment and the secondary tape-springs 1B separated from the flexible membrane 2 by the reinforcing structure. The reinforcing structure 20 interlinks the secondary tape-springs 1B by transversal braces of the same construction, and by any crossed cables 4, the function of which is to strengthen the support of the flexible membranes 2, which may prove essential when the latter are of very large size.

The reinforcing structure 20 is attached both to the primary tape-springs 1A and to the secondary tape-springs 1B.

The device according to the invention also comprises, at the level of said mandrel 10, means for offsetting the root of the secondary tape-spring or springs 1B or the root of the primary tape-spring or springs 1A at the end of deployment, so that said reinforcing structure 20 is deployed within the volume situated on the side opposite the face of the flexible membrane 2 comprising the flexible photovoltaic cells, and supports said flexible membrane 2.

A thin deployable structure is intrinsically relatively flexible and may pose problems for the maneuverability of the satellite by its low-frequency and large amplitude vibration modes. The structure comprising the primary and secondary tapes, separated by a reinforcing structure and offset, makes it possible to obtain a flexible membrane resting on a structure constituting a trellis, the mechanical stiffness of which is much greater than the stiffness of the structure consisting of only the primary tape-springs. The vibration modes of the structure have a higher frequency and a lower amplitude.

Said means for offsetting the root of said at least one primary tape-spring 1B, respectively the root of the primary tape-spring or springs 1A, are attached to the mandrel 10, and may consist of any mobile element to which is fixed said at least one secondary tape-spring 1B and not said at least one primary tape-spring 1A, or, respectively, of any mobile element to which is fixed said at least one primary tape-spring 1A and not said at least one secondary tape-spring 1B, said mobile element being displaced when the primary 1A and secondary 1B tape-springs are unwound. Thus, in the preferred embodiment, represented in FIGS. 1 to 3, the device according to the invention makes it possible to deploy two flexible membranes 2, on either side of the mandrel 10. For a first flexible membrane 2, represented to the right of the mandrel 10 in the figures, it is the root of the secondary tape-spring 1B which is offset at the end of deployment, and, conversely, for a second flexible membrane 2, represented to the left of the mandrel 10 in the figures, it is the root of the primary tape-spring 1A which is offset at the end of deployment.

According to a preferred embodiment of the invention, the mobile element mentioned above is a secondary mandrel with the same axis as the mandrel 10, capable of performing, in the unwound state, a rotation on itself of a fraction of a mandrel turn 10 so as to offset the root of said at least one secondary tape-spring 1B and/or of said at least one primary tape-spring 1A in the appropriate manner.

According to another embodiment, said mobile element consists of a mechanical actuator capable of offsetting the root of said at least one secondary tape-spring 1B, and/or, respectively, the root of said at least one primary tape-spring 1A, relative to the mandrel 10.

FIG. 3 represents the device according to the invention at the end of deployment, the root of the secondary 1B or primary 1A tape-springs being offset according to the invention, that is to say that the primary tapes 1A are separated from the secondary tapes 1B, by being separated by a reinforcing structure 20.

The invention thus proposes a deployment device for windable solar generators, having a three-dimensional reinforcing structure capable of supporting large sized solar generators, and with reduced bulk.

The invention claimed is:

1. A device for deploying at least one membrane on a face of which are arranged a set of elements capable of converting solar energy into electrical energy, said device comprising:
   a membrane comprising a set of elements capable of converting solar energy into electrical energy arranged on a face of said membrane;
   a deployment structure for each membrane to be deployed, said deployment structure comprising at least one primary tape-spring supporting said membrane,
   said deployment structure further comprising at least one secondary tape-spring, and a reinforcing structure arranged between and attached to both of said at least one primary tape-spring and said at least one secondary tape-spring,
   said device having a wound state in which said at least one primary tape-spring supporting said membrane and said at least one secondary tape-spring as well as said reinforcing structure are co-wound around a mandrel, and
   an unwound state in which said at least one primary tape-spring and said at least one secondary tape-spring are unwound, said at least one primary tape-spring and said at least one secondary tape-spring each forming a plane parallel with one another and spaced from one another in a direction perpendicular to a plane of said membrane once deployed, and
   wherein said device comprises, linked to said mandrel, a mobile element to which is fixed exclusively to either said at least one secondary tape-spring or said at least one primary tape-spring, for offsetting, in the unwound state, a root of respectively said at least one secondary tape-spring or said at least one primary tape-spring, said offsetting resulting in a movement of the mobile element and leading to a deployment of said reinforcing structure within the volume between said at least one primary tape-spring and said at least one secondary tape-spring, and said reinforcing structure then supporting said membrane, the device then being in the deployed state.

2. The device as claimed in claim 1, wherein said mobile element is a secondary mandrel with the same axis as the mandrel, capable of performing, in the unwound state, a rotation on itself of a fraction of a mandrel turn so as to offset the root of said at least one secondary tape-spring or, respectively, the root of said at least one primary tape-spring.

3. The device as claimed in claim 1, wherein said mobile element comprises a mechanical actuator capable of offsetting the root of said at least one secondary tape-spring or, respectively, the root of said at least one primary tape-spring, relative to the mandrel.

4. The device as claimed in claim 1, wherein the reinforcing structure comprises a set of cables or of link rods.

5. The device as claimed in claim 4, wherein the reinforcing structure also comprises a set of transversal braces.

6. The device as claimed in claim 1, further comprising two deployment structures, making it possible to deploy two flexible membranes, respectively on either side of the mandrel.

7. The device as claimed in claim 6, wherein, for a first membrane, the mobile element makes it possible to offset the root of said at least one secondary tape-spring and, for a second membrane, the offsetting means make it possible to offset the root of said at least one primary tape-spring.

8. The device as claimed in claim 1, wherein said membrane is flexible.

9. The device as claimed in claim 1, wherein said membrane is semi-rigid.

10. The device as claimed in claim 1, wherein said membrane comprise flexible and rigid elements.

11. The device as claimed in claim 10, wherein said flexible and rigid elements comprise thin flat braces linked flexibly together.

12. The device as claimed in claim 1, wherein said elements capable of converting the solar energy into electrical energy are flexible photovoltaic cells.

13. The device as claimed in claim 1, wherein at least one of the tape-springs comprises a layer of a material exhibiting a rigidity variation on crossing a temperature threshold.

14. The device as claimed in claim 1, the reinforcing structure once deployed is located between the primary and secondary tape-springs in the direction perpendicular to a plane of said membrane once deployed.

15. The device as claimed in claim 1, said reinforcing structure is located on an opposite side of the face of said membrane comprising the set of elements capable of converting the solar energy into electrical energy.

* * * * *